United States Patent
Jiang

(12) 
(10) Patent No.: US 10,381,594 B2
(45) Date of Patent: Aug. 13, 2019

(54) OLED DISPLAY PANEL AND DISPLAY DEVICE THEREOF

(71) Applicant: WUHAN CHINA STAR OPTOELECTRONICS TECHNOLOGY CO., LTD., Wuhan, Hubei (CN)

(72) Inventor: Guoqiang Jiang, Hubei (CN)

(73) Assignee: WUHAN CHINA STAR OPTOELECTRONICS TECHNOLOGY CO., LTD., Hubei (CN)

( * ) Notice: Subject to any disclaimer, the term of this patent is extended or adjusted under 35 U.S.C. 154(b) by 11 days.

(21) Appl. No.: 15/566,714

(22) PCT Filed: Apr. 18, 2017

(86) PCT No.: PCT/CN2017/080961
§ 371 (c)(1),
(2) Date: Oct. 15, 2017

(87) PCT Pub. No.: WO2018/170979
PCT Pub. Date: Sep. 27, 2018

(65) Prior Publication Data
US 2019/0036075 A1    Jan. 31, 2019

(30) Foreign Application Priority Data
Mar. 22, 2017 (CN) .......................... 2017 1 0174784

(51) Int. Cl.
H01L 51/00 (2006.01)
H01L 51/52 (2006.01)
H01L 27/32 (2006.01)

(52) U.S. Cl.
CPC ...... H01L 51/5253 (2013.01); H01L 27/3276 (2013.01); H01L 51/0097 (2013.01)

(58) Field of Classification Search
CPC ............. H01L 51/5253; H01L 27/3276; H01L 51/0097
See application file for complete search history.

(56) References Cited

U.S. PATENT DOCUMENTS

2016/0308151 A1* 10/2016 Kim .................... H01L 51/0097
2017/0338294 A1* 11/2017 Choi ................... H01L 27/3276
2018/0081399 A1* 3/2018 Kwon ................... G06F 1/1652

* cited by examiner

Primary Examiner — Victor A Mandala
Assistant Examiner — Colleen E Snow
(74) Attorney, Agent, or Firm — Mark M. Friedman

(57) ABSTRACT

An OLED display panel is provided and defined as: a display region, a bending region, and a driving bonding region, wherein the driving bonding region has: a driving chip; a flexible circuit board configured to achieve a connection between the driving chip and a motherboard; and a reinforcing plate disposed on and covered with a surface of the substrate wiring layer of the driving bonding region, wherein a chamber is formed in a bottom portion of the reinforcing plate, and the driving chip is located in the chamber.

13 Claims, 2 Drawing Sheets

OLED DISPLAY PANEL AND DISPLAY DEVICE THEREOF

FIELD OF THE INVENTION

The present disclosure relates to a liquid crystal display technical field, and more particularly to an OLED display panel and a display device with the OLED display device.

BACKGROUND OF THE INVENTION

An organic electroluminescence display (Organic Light-Emitting Diode; referred to as OLED) device is a novel flat panel display. The organic electroluminescence display device has received more and more attention, and may become the next generation of display technology, replacing liquid crystal displays, due to having the properties of active emitting, high brightness, wide viewing angle, fast response, low power consumption, and flexibility.

Flexible OLED display technologies continue to mature, and categories of flexible display products continue to diversify. Frameless display products have become a mainstream in markets, and process requirements of the frameless display products are also increasing, wherein a bending technology of a panel driving region has become a key point for determining a yield. The bending technology of the panel driving region is to bend the panel driving region for fitting a panel back portion, so as to save an occupied space of the driving region and raise a screen-to-body ratio, thereby achieving a full-screen display effect.

However, in the conventional technologies, technical problems exist upon bending parts of the panels, as follows: (1) irregular deformations easily appear in a flexible panel upon bending, due to a flexible substrate in the panel having a very thin thickness and a soft material, so as to induce a poor bending accuracy; (2) a driving bonding region is prevented from pressing, and a fitting defect in the driving region appears upon bending; and (3) after bending, a driving chip is higher than the panel, and risks of collision, crushing, and scratching in subsequent processes are increased.

Therefore, the conventional technologies has existing defects and needs to be improved.

SUMMARY OF THE INVENTION

The present disclosure provides an OLED display panel, which can improve the toughness of parts of flexible substrates and has a protection on a driving chip, so as to solve the technical problems of a poor bending accuracy of parts of panels induced by a material problem of the flexible substrates upon bending and the driving chip without being protected after the bending of parts of the panels, so as to influence the display effect.

In order to solve the above problems, the present disclosure provides technical solutions as follows:

The present disclosure provides an OLED display panel, defined as:
a display region comprising: a first protective layer, a flexible substrate, a substrate wiring layer, and a display element layer which are sequentially stacked and disposed, wherein the flexible substrate and the substrate wiring layer are extended toward a side of the display region;
a bending region being a first extending portion of the flexible substrate and the substrate wiring layer; and
a driving bonding region being a second extending portion of the flexible substrate and the substrate wiring layer, wherein the second extending portion is located outside the first extending portion; wherein the driving bonding region comprises:
a driving chip disposed on a surface of the substrate wiring layer and configured to input a required voltage to each of pixels;
a flexible circuit board configured to achieve a connection between the driving chip and a motherboard;
a reinforcing plate disposed on and covered with a surface of the substrate wiring layer of the driving bonding region, wherein a chamber is formed in a bottom portion of the reinforcing plate, and the driving chip is located in the chamber; and
a first opening disposed in a top portion of the chamber of the reinforcing plate, wherein a plane at which the top portion of the chamber located is parallel and aligned to a top surface of the driving chip.

According to a preferred embodiment of the present disclosure, a plurality of adhesive grooves are disposed in the bottom portion of the reinforcing plate.

According to a preferred embodiment of the present disclosure, a second opening is disposed in a side of the chamber of the reinforcing plate, the second opening is towards the driving chip and connected to an end of the flexible circuit board, and a top portion of the second opening is slightly higher than an upper surface of the flexible circuit board.

According to a preferred embodiment of the present disclosure, a second protective layer is fabricated between the flexible substrate and the substrate wiring layer of the bending region; and a third protective layer is fabricated on an upper surface of the substrate wiring layer.

According to a preferred embodiment of the present disclosure, the reinforcing plate is integrally molded with a rigid PET material.

The present disclosure further provides an OLED display panel, defined as:
a display region comprising: a first protective layer, a flexible substrate, a substrate wiring layer and a display element layer which are sequentially stacked and disposed, wherein the flexible substrate and the substrate wiring layer are extended toward a side of the display region;
a bending region being a first extending portion of the flexible substrate and the substrate wiring layer; and
a driving bonding region being a second extending portion of the flexible substrate and the substrate wiring layer, wherein the second extending portion is located outside the first extending portion; wherein the driving bonding region comprises:
a driving chip disposed on a surface of the substrate wiring layer and configured to input a requiring voltage to each of the pixels;
a flexible circuit board configured to achieve a connection between the driving chip and a motherboard; and
a reinforcing plate disposed on and covered with a surface of the substrate wiring layer of the driving bonding region, wherein a chamber is formed in a bottom portion of the reinforcing plate, and the driving chip is located in the chamber.

According to a preferred embodiment of the present disclosure, a plurality of adhesive grooves are disposed in the bottom portion of the reinforcing plate.

According to a preferred embodiment of the present disclosure, a second opening is disposed in a side of the chamber of the reinforcing plate, the second opening is towards the driving chip and connected to an end of the flexible circuit board, and a top portion of the second opening is slightly higher than an upper surface of the flexible circuit board.

According to a preferred embodiment of the present disclosure, a second protective layer is fabricated between the flexible substrate and the substrate wiring layer of the bending region; and a third protective layer is fabricated on an upper surface of the substrate wiring layer.

According to a preferred embodiment of the present disclosure, the reinforcing plate is integrally molded with a rigid PET material.

According to the above purpose of the present disclosure, an OLED display device is provided and comprises: an OLED display panel, defined as:
- a display region comprising: a first protective layer, a flexible substrate, a substrate wiring layer and a display element layer which are sequentially stacked and disposed, wherein the flexible substrate and the substrate wiring layer are extended toward a side of the display region;
- a bending region being a first extending portion of the flexible substrate and the substrate wiring layer; and
- a driving bonding region being a second extending portion of the flexible substrate and the substrate wiring layer, wherein the second extending portion is located outside the first extending portion; wherein the driving bonding region comprises:
  - a driving chip disposed on a surface of the substrate wiring layer and configured to input a requiring voltage to each of pixels;
  - a flexible circuit board configured to achieve a connection between the driving chip and a motherboard; and
  - a reinforcing plate disposed on and covered with a surface of the substrate wiring layer of the driving bonding region, wherein a chamber is formed in a bottom portion of the reinforcing plate, and the driving chip is located in the chamber.

According to a preferred embodiment of the present disclosure, a first opening is disposed in a top portion of the chamber of the reinforcing plate, wherein a plane at which the top portion of the chamber located is parallel and aligned to a top surface of the driving chip.

According to a preferred embodiment of the present disclosure, a second opening is disposed in a side of the chamber of the reinforcing plate, the second opening is towards the driving chip and connected to an end of the flexible circuit board, and a top portion of the second opening is slightly higher than an upper surface of the flexible circuit board.

According to a preferred embodiment of the present disclosure, a second protective layer is fabricated between the flexible substrate and the substrate wiring layer of the bending region; and a third protective layer is fabricated on an upper surface of the substrate wiring layer.

According to a preferred embodiment of the present disclosure, the reinforcing plate is integrally molded with a rigid PET material.

The beneficial effects of the present disclosure are that: in comparison with a conventional OLED display panel, the OLED display panel of the present disclosure improves toughness of parts of flexible substrates by disposing a reinforcing plate in a driving region, so as to achieve easy bending; reducing an amount of deformation of the flexible substrates; and improving a fitting accuracy and inducing a protection on a driving chip. Therefore, the technical problems in the conventional OLED display panels, in which a poor bending accuracy of parts of panels is induced by a material problem of the flexible substrates upon bending and the driving chip is not protected after the bending of parts of the panels, so as to influence the display effect, are solved.

DESCRIPTION OF THE DRAWINGS

In order to more clearly describe embodiments of the present disclosure or technical solutions in a conventional technology, drawings required to be used for the embodiments or descriptions of the conventional technology are simply described hereinafter. Apparently, the drawings described below only illustrate some embodiments of the present disclosure. Those skilled in the art can obtain other drawings based on these drawings disclosed herein without creative effort.

DETAILED DESCRIPTION OF THE PREFERRED EMBODIMENTS

The following description of the embodiments with reference to the appended drawings is used for illustrating specific embodiments which may be used for carrying out the present disclosure. The directional terms described by the present disclosure, such as "upper", "lower", "front", "back", "left", "right", "inner", "outer", "side", etc., are only directions by referring to the accompanying drawings. Thus, the used directional terms are used to describe and understand the present disclosure, but the present disclosure is not limited thereto. In figures, elements with similar structures are indicated by the same numbers.

The present disclosure is focused on the conventional OLED display panels, which have technical problems of a poor bending accuracy of parts of panels induced by a material problem of flexible substrates and the driving chip without being protected after the bending of the panel portion, so as to influence the display effect. The present embodiment can solve the defects.

Figure 1:
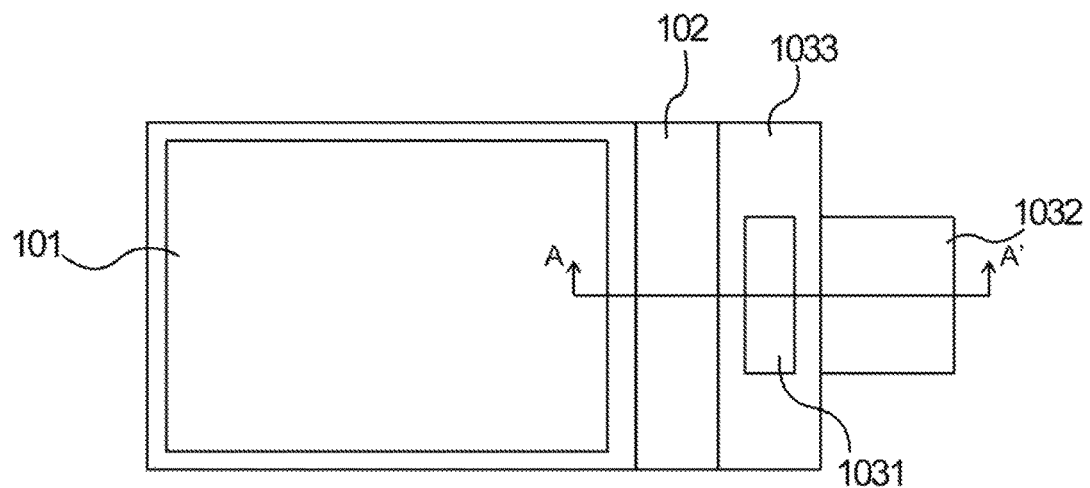
FIG. 1 is a structural top view of an OLED display panel of the present disclosure.

As shown in FIG. 1, the present disclosure provides an OLED display panel, defined as: a display region 101, a bending region 102, and a driving bonding region. The bending region 102 and the driving bonding region are extending portions of the display region 101. The driving bonding region has a driving chip 1031, and the driving chip 1031 is connected with a flexible circuit board 1032. The driving bonding region has a reinforcing plate 1033.

Figure 2:
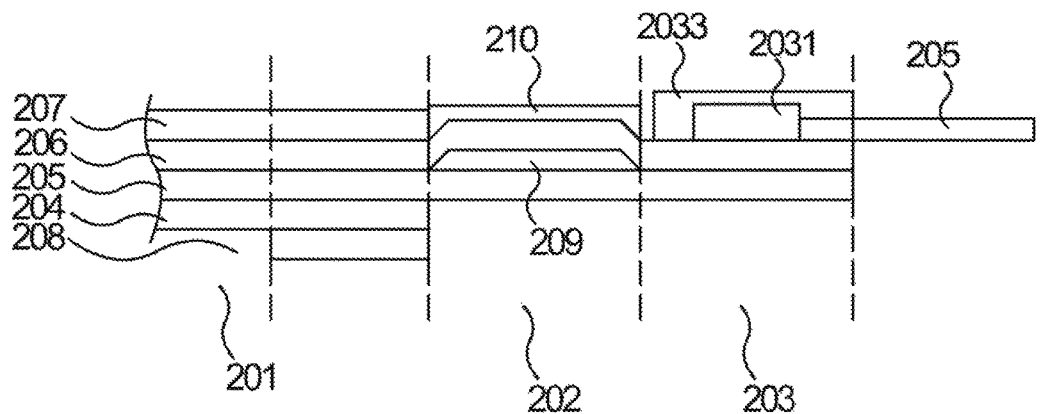
FIG. 2 is a cross-sectional schematic diagram of an OLED display panel along line A-A' in FIG. 1.

As shown in FIG. 2, in the OLED display panel, the display region 201 comprises: a first protective layer 204, a flexible substrate 205, a substrate wiring layer 206, and a display element layer 207, which are sequentially stacked and disposed. The flexible substrate 205 and the substrate wiring layer 206 are extended toward a side of the display region 201. An adhesive layer 208 is disposed on a bottom surface of the first protective layer 204. The bending region 202 is a first extending portion of the flexible substrate 205 and the substrate wiring layer 206. A second protective layer 209 is fabricated between the flexible substrate 205 and the substrate wiring layer 206 of the bending region 202. A third protective layer 210 is fabricated on an upper surface of the substrate wiring layer 206. A driving bonding region 203 is a second extending portion of the flexible substrate 205 and the substrate wiring layer, wherein the second extending portion is located outside the first extending portion.

The driving bonding region 203 has: a driving chip 2031 disposed on a surface of the substrate wiring layer 206 and configured to input a requiring voltage to each of pixels; a flexible circuit board 2032 configured to achieve a connection between the driving chip 2031 and a motherboard; and a reinforcing plate 2033 adhered to and covered with a surface of the substrate wiring layer 206 of the driving bonding region 203, wherein a chamber is formed in a bottom portion of the reinforcing plate 2033, and the driving chip 2031 is located in the chamber.

When the OLED display panel is bent, the bending region 202 is bent and folded with respect to the display region 201. The driving bonding region 203 is connected with the bending region 202. The driving bonding region 203 is jointly transferred to a lower side of the display region 201 while the bending region 202 is bent, and the flexible substrate 205 located in the driving bonding region 203 is adhesive to the adhesive layer 208 in the display region 201. During the bending, the flexible substrate located at the bending region 202 and at the driving bonding region 203 is relatively soft, and a relatively ideal bending effect is difficult to achieve. Therefore, an irregular deformation of the flexible substrate 205 located at the bending region 202 is prevented by disposing the reinforcing plate 2033 on the surface of the flexible substrate 205 located at the driving bonding region 203, wherein the reinforcing plate 2033 is coordinated with the flexible substrate 205 located at the display region 201 and is used as a support of the flexible substrate 205 located at the bending region 202.

In order to better increase the toughness of the flexible substrate 205 for forming a relatively ideal bending shape such that the reinforcing plate 2033 is covered with the surface of the flexible substrate 205 located at the driving bonding region 203, the reinforcing plate 2033 is injection-molded with a rigid PET (polyethylene terephthalate) material.

The reinforcing plate 2033 is adhered to and disposed on the surface of the flexible substrate 205 located at the driving bonding region 203, prior to the bending of an end product of the OLED display panel.

Figure 3:
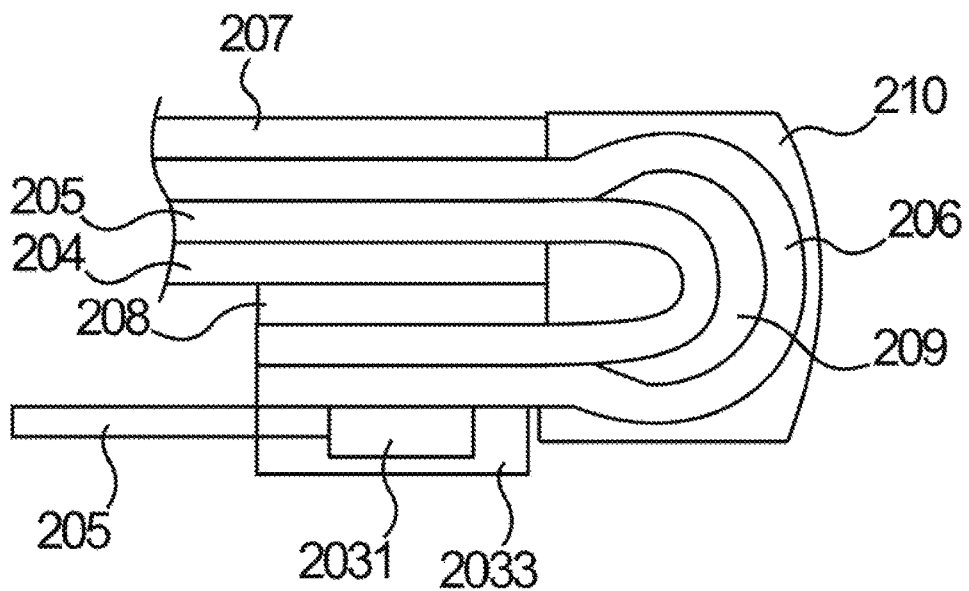
FIG. 3 is a bending state diagram of an OLED display panel in FIG. 2.

FIG. 3 is a bending state of the OLED display panel. Reference numbers are identical to those in FIG. 2, and the specific structure is not repeated again.

Figure 4:
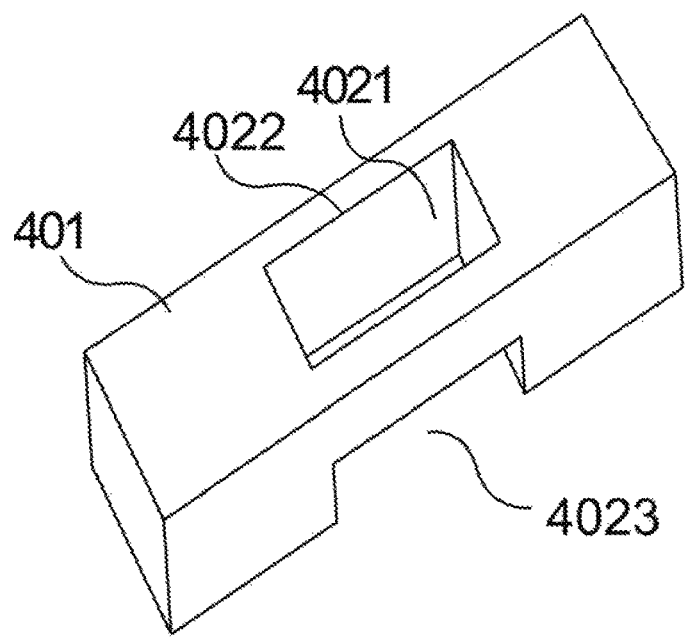
FIG. 4 is a structural top view of a reinforcing plate of an OLED display panel of the present disclosure.

As shown in FIG. 4, the reinforcing plate 401 includes a body thereof. A chamber 4021 is formed in a bottom portion of the reinforcing plate 401. The chamber 4021 is used to evade a position of the driving chip and is able to protect the driving chip simultaneously, so as to avoid a risk of being scratched easily due to the driving chip protruding from the back portion of the OLED display panel after the bending.

A first opening 4022 is disposed in a top portion of the reinforcing plate 401. The chamber 4021 is extended upwardly to the top portion of the reinforcing plate 401 and combined with the first opening 4022. After placing the driving chip in the chamber 4021, a top surface of the driving chip is parallel and aligned to a plane at which the first opening 4022 located, such that a thickness of the reinforcing plate 401 can be reduced. Therefore, a thickness of the product is not increased by the disposing of the fixing plate.

A second opening 4023 is disposed in the reinforcing plate 401 towards an end of the driving chip connected with the flexible circuit board, and a top portion of the second opening 4023 is slightly higher than the flexible circuit board. An end of the flexible circuit board is extended from the second opening 4023 into the chamber 4021 for connecting with pins of the driving chip. An oppressive effect on end portions of the flexible circuit board can be induced by the top portion of the second opening 4023, and the stability of connecting the flexible circuit board with the driving chip can be improved.

A plurality of adhesive grooves are disposed in the bottom portion of the reinforcing plate 401. When the reinforcing plate 401 is adhered to the flexible substrate, a glue is not pushed out of an adhesive surface of the bottom portion of the reinforcing plate 401, but is gathered in the adhesive grooves of the bottom portion of the reinforcing plate 401, so as to eliminate the trouble of cleaning the residual glue. Furthermore, the adhesive grooves increase an adhesive area between the bottom portion of the reinforcing plate and the flexible substrate, and the fixation of the reinforcing plate 401 is further enhanced.

The present disclosure provides an OLED display device comprising: an OLED display panel, defined as: a display region comprising: a first protective layer, a flexible substrate, a substrate wiring layer and a display element layer which are sequentially stacked and disposed, wherein the flexible substrate and the substrate wiring layer are extended toward a side of the display region; a bending region being a first extending portion of the flexible substrate and the substrate wiring layer; and a driving bonding region being a second extending portion of the flexible substrate and the substrate wiring layer, wherein the second extending portion is located outside the first extending portion; wherein the driving bonding region comprises: a driving chip disposed on a surface of the substrate wiring layer and configured to input a requiring voltage to each of pixels; a flexible circuit board configured to achieve a connection between the driving chip and a motherboard; and a reinforcing plate adhesive to and covered with a surface of the substrate wiring layer of the driving bonding region, wherein a chamber is formed in a bottom portion of the reinforcing plate, and the driving chip is located in the chamber.

The operation principle of the OLED display device of the present preferred embodiment is identical to that of the OLED display panel of the above preferred embodiment. Specifically, the operation principle of the OLED display panel of the preferred embodiment described above can be referred thereto, and here is not repeated again.

The beneficial effects are that: in comparison with a conventional OLED display panel, the OLED display panel of the present disclosure improves toughness of parts of flexible substrates by disposing a reinforcing plate in a driving region, so as to achieve easy bending; reducing an amount of deformation of the flexible substrates; and improving a fitting accuracy and inducing a protection on a driving chip. Therefore, the technical problems in the conventional OLED display panels, which a poor bending accuracy of parts of panels is induced by a material problem of the flexible substrates upon bending and the driving chip is not protected after the bending of parts of the panels, so as to affect the display effect, are solved.

As described above, although the present disclosure has been described in preferred embodiments, they are not intended to limit the invention. One of ordinary skill in the art, without departing from the spirit and scope of the invention within, can make various modifications and variations, so the range of the scope of the invention is defined by the claims.

What is claimed is:

1. An OLED display panel, defined as:
   a display region comprising a first protective layer, a flexible substrate, a substrate wiring layer, and a display element layer which are sequentially stacked and disposed, wherein the flexible substrate and the substrate wiring layer are extended toward a side of the display region;
   a bending region being a first extending portion of the flexible substrate and the substrate wiring layer; and
   a driving bonding region being a second extending portion of the flexible substrate and the substrate wiring layer, wherein the second extending portion is located outside the first extending portion; wherein the driving bonding region comprises:
      a driving chip disposed on a surface of the substrate wiring layer and configured to input a voltage to each pixel;
      a flexible circuit board configured to achieve a connection between the driving chip and a motherboard;
      a reinforcing plate disposed on and covered with a surface of the substrate wiring layer of the driving bonding region, wherein a chamber is formed in a bottom portion of the reinforcing plate, and the driving chip is located in the chamber; and
      a first opening disposed in a top portion of the chamber of the reinforcing plate, wherein a plane at which the top portion of the chamber located is parallel and aligned to a top surface of the driving chip.

2. The OLED display panel according to claim 1, wherein the reinforcing plate is disposed on the surface of the substrate wiring layer of the driving bonding region, and a plurality of adhesive grooves are disposed in the bottom portion.

3. The OLED display panel according to claim 1, wherein a second opening is disposed in a side of the chamber of the reinforcing plate, the second opening is towards the driving chip and connected to an end of the flexible circuit board, and a top portion of the second opening is slightly higher than an upper surface of the flexible circuit board.

4. The OLED display panel according to claim 1, wherein a second protective layer is fabricated between the flexible substrate and the substrate wiring layer of the bending region, and a third protective layer is fabricated on an upper surface of the substrate wiring layer.

5. The OLED display panel according to claim 1, wherein the reinforcing plate is integrally molded with a rigid PET material.

6. An OLED display panel, defined as:
   a display region comprising: a first protective layer, a flexible substrate, a substrate wiring layer, and a display element layer which are sequentially stacked and disposed, wherein the flexible substrate and the substrate wiring layer are extended toward a side of the display region;
   a bending region being a first extending portion of the flexible substrate and the substrate wiring layer, wherein a second protective layer is fabricated between the flexible substrate and the substrate wiring layer of the bending region, and a third protective layer is fabricated on an upper surface of the substrate wiring layer; and
   a driving bonding region being a second extending portion of the flexible substrate and the substrate wiring layer, wherein the second extending portion is located outside the first extending portion; wherein the driving bonding region comprises:
      a driving chip disposed on a surface of the substrate wiring layer and configured to input a voltage to each pixel;
      a flexible circuit board configured to achieve a connection between the driving chip and a motherboard; and
      a reinforcing plate disposed on and covered with a surface of the substrate wiring layer of the driving bonding region, wherein a chamber is formed in a bottom portion of the reinforcing plate, and the driving chip is located in the chamber.

7. The OLED display panel according to claim 6, wherein the reinforcing plate is disposed on the surface of the substrate wiring layer of the driving bonding region, and a plurality of adhesive grooves are disposed in the bottom portion.

8. The OLED display panel according to claim 6, wherein a second opening is disposed in a side of the chamber of the reinforcing plate, the second opening is towards the driving chip and connected to an end of the flexible circuit board, and a top portion of the second opening is slightly higher than an upper surface of the flexible circuit board.

9. The OLED display panel according to claim 6, wherein the reinforcing plate is integrally molded with a rigid PET material.

10. An OLED display device, comprising:
    an OLED display panel, defined as:
       a display region comprising: a first protective layer, a flexible substrate, a substrate wiring layer, and a display element layer which are sequentially stacked and disposed, wherein the flexible substrate and the substrate wiring layer are extended toward a side of the display region;
       a bending region being a first extending portion of the flexible substrate and the substrate wiring layer, wherein a second protective layer is fabricated between the flexible substrate and the substrate wiring layer of the bending region, and a third protective layer is fabricated on an upper surface of the substrate wiring layer; and
       a driving bonding region being a second extending portion of the flexible substrate and the substrate wiring layer, wherein the second extending portion is located outside the first extending portion; wherein the driving bonding region comprises:
          a driving chip disposed on a surface of the substrate wiring layer and configured to input a requiring voltage to each of pixels;
          a flexible circuit board configured to achieve a connection between the driving chip and a motherboard; and
          a reinforcing plate disposed on and covered with a surface of the substrate wiring layer of the driving bonding region, wherein a chamber is formed in a bottom portion of the reinforcing plate, and the driving chip is located in the chamber.

11. The OLED display device according to claim 10, wherein a first opening is disposed in a top portion of the chamber of the reinforcing plate, wherein a plane at which the top portion of the chamber located is parallel and aligned to a top surface of the driving chip.

12. The OLED display device according to claim 11, wherein a second opening is disposed in a side of the chamber of the reinforcing plate, the second opening is towards the driving chip and connected to an end of the flexible circuit board, and a top portion of the second opening is slightly higher than an upper surface of the flexible circuit board.

13. The OLED display device according to claim 10, wherein the reinforcing plate is integrally molded with a rigid PET material.

* * * * *